United States Patent [19]

Tsushima et al.

[11] Patent Number: 5,049,927
[45] Date of Patent: Sep. 17, 1991

[54] PROCESS FOR RECORDING AN IMAGE, A FILM STRUCTURE THEREFOR AND ITS APPLICATIONS

[75] Inventors: Hiroshi Tsushima; Masami Kawabata; Yasuyuki Takimoto, all of Takatsuki, Japan

[73] Assignee: Nippon Paint Co., Ltd., Osaka, Japan

[21] Appl. No.: 603,841

[22] Filed: Oct. 29, 1990

[30] Foreign Application Priority Data

Oct. 27, 1989 [JP] Japan ................................. 1-280603
Jul. 26, 1990 [JP] Japan ............................. 2-79952[U]

[51] Int. Cl.$^5$ ...................... G03B 27/72; G03B 27/02
[52] U.S. Cl. ..................................... 355/71; 355/132; 355/133
[58] Field of Search .................... 355/71, 77, 133, 132; 346/160

[56] References Cited

U.S. PATENT DOCUMENTS

| | | | |
|---|---|---|---|
| 3,923,379 | 12/1975 | Kumada | 355/71 X |
| 4,017,156 | 4/1977 | Moriyama et al. | 355/71 X |
| 4,239,385 | 12/1980 | Hujer | 355/71 |
| 4,581,619 | 4/1986 | Mizutome et al. | 346/160 |
| 4,589,732 | 5/1986 | Shiraishi et al. | 355/71 X |
| 4,784,476 | 11/1988 | Schulman et al. | 355/71 X |
| 4,927,242 | 5/1990 | Aoki et al. | 355/71 X |

*Primary Examiner*—Richard A. Wintercorn
*Attorney, Agent, or Firm*—Wenderoth, Lind & Ponack

[57] ABSTRACT

The present invention provides a new process for recording an image by using the above mentioned phenomenon. The process comprises (i) inserting an anisotropic molecular oriented film between two polarizing film of which polarization directions are parallel or perpendicular to each other, so that the anisotropy of said anisotropic molecular oriented film forms an angle of 45° to the polarization directions of said polarizing film, and (ii) completely or incompletely degrading the anisotropy of an image portion in said anisotropic molecular oriented film.

5 Claims, 4 Drawing Sheets

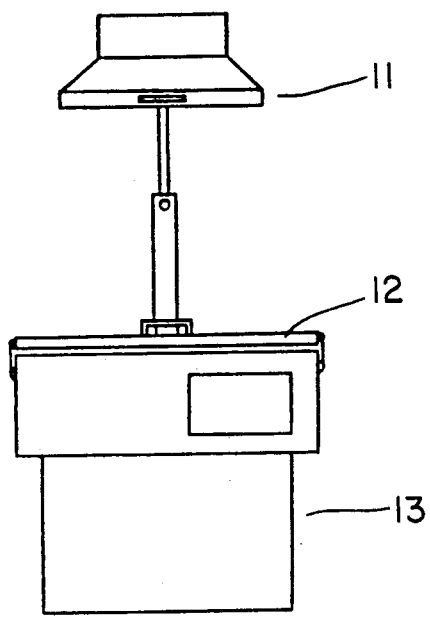
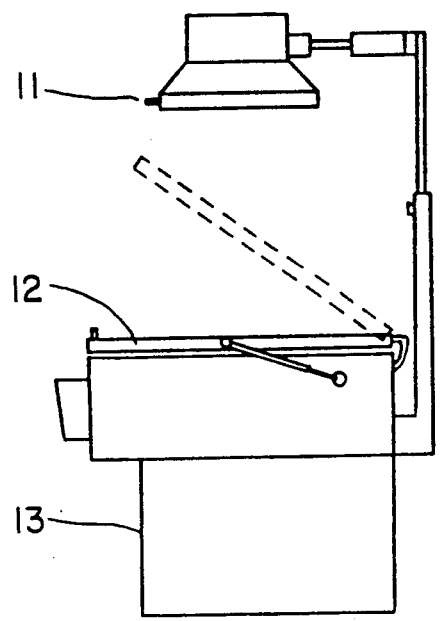
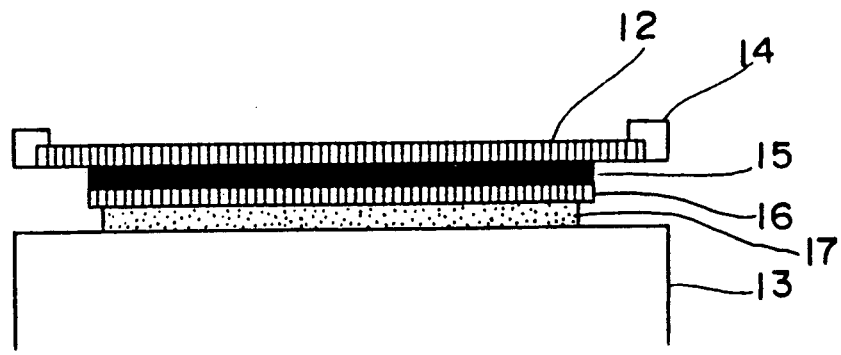

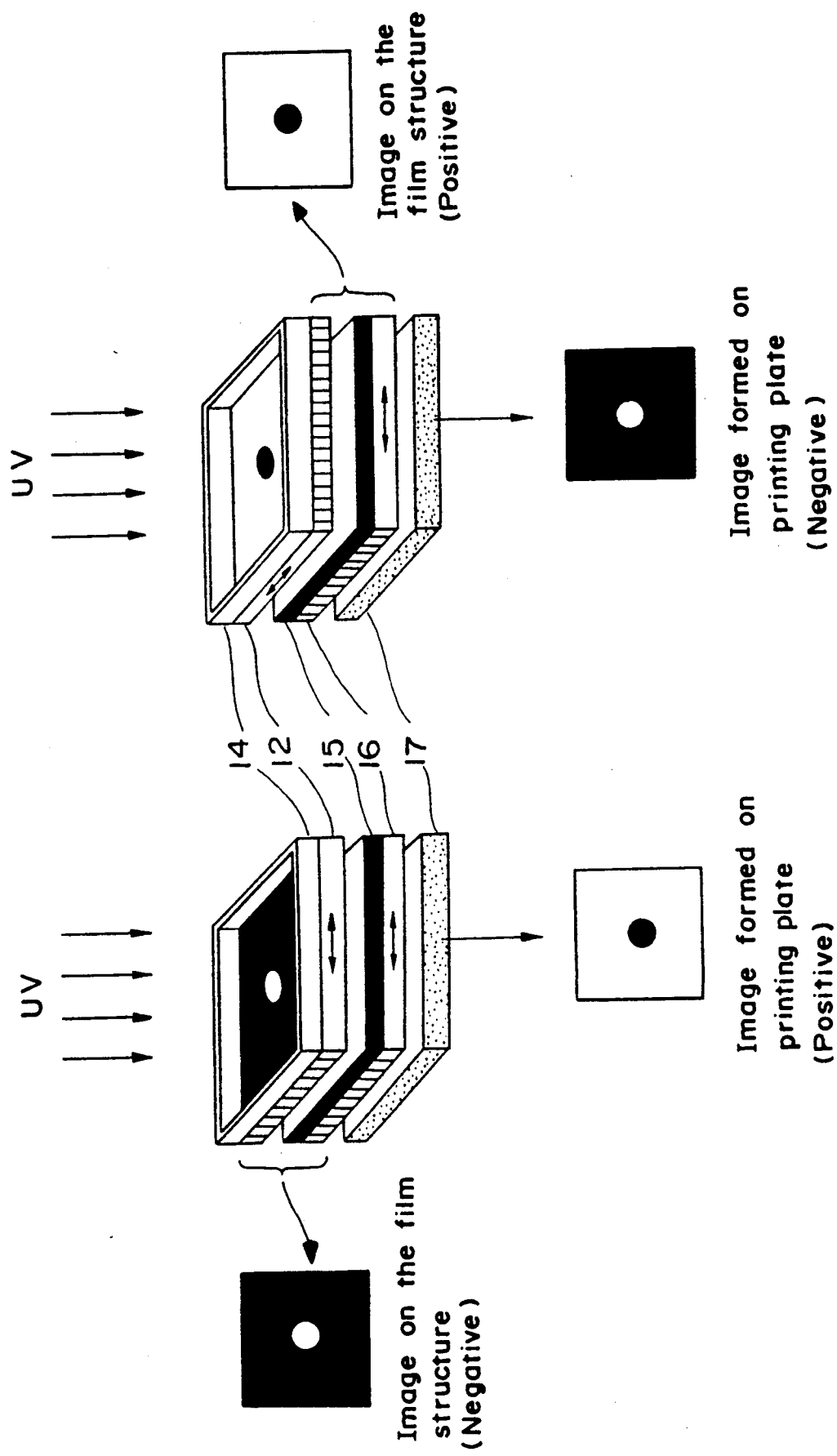

FIG. 6

| Example No. | Image | Contrast | Peculiarities |
|---|---|---|---|
| 1 | Black / Light yellow | Good | Positive image |
| 2 | Colorless / Blue | Good | Negative image |
| 3 | Black / Light yellow | Good | Positive image and high contrast |
| 4 | 572 nm ⇌ 546 nm | Good | Positive image and erasable |
| 5 | Blue / Red; Exposing amount 1/2, 1/3 Green | Good | Color image |
| 6 | Green, Blue, Black; Exposing amount 1, 2, 3 times Red | Good | Color image |

PROCESS FOR RECORDING AN IMAGE, A FILM STRUCTURE THEREFOR AND ITS APPLICATIONS

FIELD OF THE INVENTION

The present invention relates to a process for recording an image, a film structure therefor and its application.

BRIEF EXPLANATION OF THE DRAWINGS

FIG. 3 shows a front view and a side view of one embodiment of the apparatus of the present invention.

FIG. 4 schematically shows a sectional view of the positive or negative film.

FIG. 5 schematically explains the conversion system of positive and negative.

FIG. 6 shows the results of Examples.

BACKGROUND OF THE INVENTION

Figure 1:
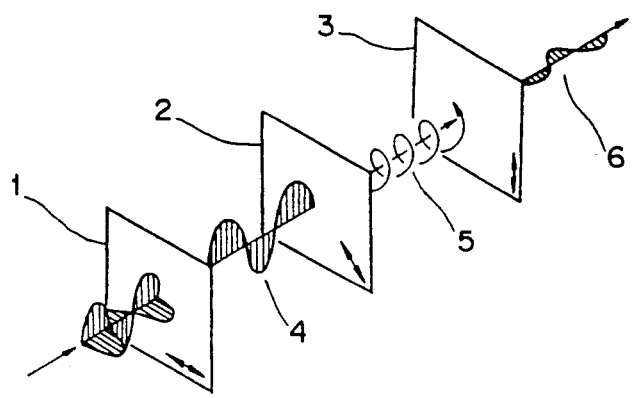
FIG. 1 schematically is a drawing which explains the theoritical principle of the present invention.
Figure 2A:
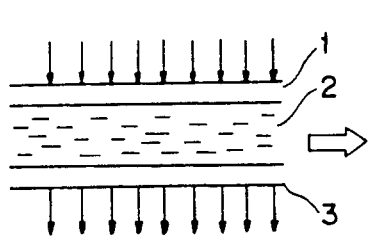
FIG. 2 is a drawing which explains an image recording process of the present invention.
Figure 2B:
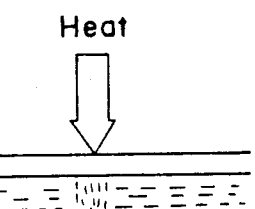
Figure 2C:
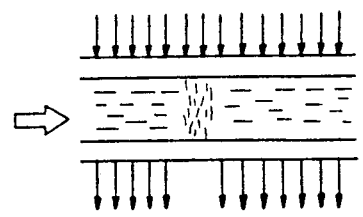
Figure 2D:
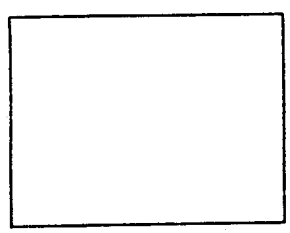
Figure 2E:
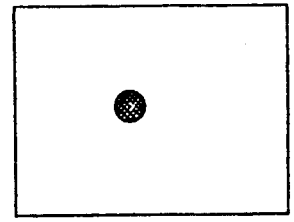

It has been known to the art that an anisotropic polymer film which has been molecular-oriented in a specific direction is inserted between two polarizing films to develop color. The reason why color is developed is as follow: As shown in FIG. 1, if an anisotropic molecular oriented film 2 is inserted between two polarizing films 1 and 3 of which polarization directions are perpendicular to each other, and if the axes of the oriented moleculars form an angle of 45° to the polarization directions of the polarizing films, the light from a light source is passed through the polarizing film 1 to form linearly polarized light 4 which is then changed to elliptically polarized light 5 by passing through the anisotropic molecular oriented film 2. The elliptically polarized light 5 is further passed through the second polarizing film 3 and changed to colored polarized light 6 which is seen colored.

This principle is tried to apply fibers or fabrics and it is desired to produce iridescent knit wears, stage wears, interia curtains and colored displays (See The Gist of Lectures at the Annual Meeting in 1986 of the Fiber Society of Japan, 153 page, by Kiyokazu Matsumoto et al).

The above attempts are all concentrated on color development, and no other functions have not been studied.

SUMMARY OF THE INVENTION

The present invention provides a new process for recording an image by using the above mentioned phenomenon. The process comprises (i) inserting an anisotropic molecular oriented film between two polarizing films of which polarization directions are parallel or perpendicular to each other, so that the anisotropy of said anisotropic molecular oriented film forms an angle of 45° to the polarization directions of said polarizing film, and (ii) completely or incompletely degrading the anisotropy of an image portion in said anisotropic molecular oriented film. One of the polarizing films may be changed to a reflective film.

The present invention also provides a film structure for recording an image comprising two polarizing films of which polarization directions are parallel or perpendicular to each other and an anisotropic molecular oriented film sandwiched between the two polarizing films, wherein the anisotropic molecular oriented film has an anisotropy of molecular orientation which forms an angle of about 45° to the polarization directions of said polarizing films and has an image portion of which the anisotropy of the molecular orientation is degraded completely or incompletely by heat or light. One of the polarizing films may be change to a reflective film.

The present invention further provides a new application of the above process and film structure. The application is directed to a printing apparatus in which a negative or positive type photosensitive printing plate is exposed to a light source through a negative or positive film, wherein said negative or positive film comprises two polarizing films of which polarization directions are parallel or perpendicular to each other and an anisotropic molecular oriented film sandwiched between said two polarizing films, and the anisotropic molecular oriented film has an anisotropy of molecular orientation which forms an angle of about 45° to the polarization directions of said polarizing films and has an image portion of which the anisotropy of the molecular orientation is degraded completely or incompletely by heat or light.

DETAILED DESCRIPTION OF THE INVENTION

The polarizing film employed in the present invention is not limited, but preferred are those having good physical stabilities, such as heat resistance, weather resistance, water resistance and also having good polarizing degree. The polarizing film may be commercially available, including KAYAPOLAR KPL-23 and NITTO T-1205.

The anisotropic molecular oriented film of the present invention is a polymer film which is uniaxially or biaxially oriented 1.5 to 6 times to align the axes of polymer molecules parallel to the polymer film surface. Examples of the polymer films are polyvinyl chloride, polymethyl methacrylate, polystyrene, polyethylene, polypropylene, polyethylene terephthalate, polyamide, polyvinyl alcohol and the like. In order to enhance an efficiency of changing to anisotropy, an additive (such as, a plasticizer and a dye stuff) may be added to the polymer film. The anisotropic molecular oriented polymer film may be composed of one layer or more than one layers. The plural layers may be prepared either from same polymer materials which have different stretch percents, or from the different polymer materials. The polymer film may be prepared from a photodegradative polymer, which is exposed to light and then subjected to heat to degrade the anisotropy of the molecular orientation. The polymer film may also be prepared from a light-isomerizable polymer. The isomerization reaction makes it possible to reversibly convert the degradation of the anisotropy of the molecular orientation, whereby a formation and an elimination of images can be reversibly conducted. Examples of the light-isomerizable polymers are reported in detail in "Lectures of Chemical Fibers" by Eiichi Kobayashi et al., vol. 44, page 95 (1987).

In the present invention, the two polarizing films are arranged as the polarization directions are parallel or perpendicular to each other and the anisotropic molecular oriented film is inserted therebetween as an angle of the axes of the molecular orientation and the polarization directions is about 45°. In the present invention, angles including parallel and perpendicular are not defined strictly, so that an angle of 45°, for example, is understood as having a breadth of about ±10°.

In the present invention, the two polarizing films are generally employed, but one of the polarizing films may be changed to a reflective film (or plate) so as to perform the same function of the present invention. The reflective film (or plate) includes a mirror, a metal (e.g. aluminum)deposited film and the like.

The anisotropic molecular oriented film of the present invention has an image portion of which the anisotropy of the molecular orientation is degraded by heat or light. The degradation of the anisotropy is conducted completely or incompletely. If the degradation is conducted incompletely, the image portion may be colored because some degree of the anisotropy of the molecular orientation is left. If the degradation is completely conducted, the image portion is either colorless or black according to the angle (i.e. parallel or perpendicular) of the polarization directions of the two polarizing films. The degradation by heat is generally carried out by exposing the image portion of the film to a heat-mode laser or a heat head. If it is conducted by light, preferred are a digital recording process using laser beam, an analog recording process using a mercury lamp and the like. If the anisotropic film has more than one layers, the degradation can be carried out gradually and therefore it is easy to control color.

The image recording process of the present invention is explained by FIG. 2. FIGS. 2 (a), (b) and (c) schematically show sectional views of the film structure of the present invention and FIGS. 2 (d) and (e) show plane views of the structure of the present invention. The anisotropic molecular oriented film 2 is inserted between the two polarizing films 1 and 3. The anisotropy of molecular orientation is degraded by heat or light as shown in FIG. 2 (b) and the degraded portion does not permit light to get through and develops a black image, as shown in FIGS. 2 (c) and (e), thus finishing the recording process. In FIG. 2, since the angle of the polarization directions of the two polarizing films is 90°, the degraded portion of the anisotropy does not permit light to get through and develops black color, thus obtaining a positive image. If the polarization directions of the two polarizing films are parallel, the degraded portion adversely permits light to get through and forms a negative image.

As one of the application of the above mentioned structure and process, a printing apparatus as shown in FIGS. 3 to 5 is explained. FIG. 3 shows a front view and a side view of the apparatus. In FIG. 3, 11 is a light source and 12 is a cover which contacted with a combination of an anisotropic molecular oriented film having an image portion and another polarizing film under vacuum. The number 13 indicates a body which includes a vacuum pump, a light controlling device and the like. The light source 1 and the body 3 have no difference from a conventional printing apparatus, but the cover 12 is a polarizing film in the present invention. FIG. 4 schematically shows a sectional view of the cover 12 and the above mentioned film combination. In FIG. 4, 13 is a blanket of the body and 14 is a frame of the cover 12. Between the cover 12 and the blanket 13, the anisotropic molecular oriented film 15, the other polarizing film 16 and a photosensitive printing plate 17 are sandwiched. In the present invention, the cover 12 is a polarizing film and is constructed as removal, so that the conversion of positive and negative is very easily conducted by changing the direction of polarization of the cover 12. The conversion system is clearly understood from FIG. 5. The conversion may be conducted by changing the polarizing direction of the other polarizing film 16.

According to the present invention, the conversion of a positive image and a negative image is very easily conducted by changing an angle of the polarizing axes of the two polarizing films. The polarizing film and the anisotropic molecular oriented film are both commercially available as industrial products and therefore cheap enough to reduce the producing cost. The films are obtainable in a large area and the obtained image is also made large area. Since the process of the present invention does not use a liquid developer and does not have developing and fixing steps, a very simplified process is performed. Also, the process is based on physical image formation and therefore different from a conventional process which employs much chemical reactions. Color selection is also conducted by controlling a heat or light exposure amount without color dyestuffs. Further, a color contrast of white and black is high sufficient to apply photosensitive printing plates and the others.

In the printing apparatus of the present invention, the conversion of negative and positive can be easily and simply conducted.

EXAMPLES

The present invention is illustrated by the following Examples which, however, are not to be construed as limiting the present invention to their details.

Example 1

A uniaxially oriented polyethylene film was inserted between two polarizing films which were perpendicular and laminated by an adhesive to form a film structure having light yellow color. The structure was exposed to a semiconductor laser as shown in FIG. 2. The conditions of the images are shown in FIG. 6.

Example 2

A film structure was obtained as generally described in Example 1, with the exception that the two polarizing films were set parallel instead. The obtained film showed dark blue. The structure was exposed to a semiconductor laser as shown in FIG. 2. The conditions of the images are shown in FIG. 6.

Example 3

A uniaxially oriented light-degradation film (polyvinyl chloride which was treated with hexachloroacetone) was inserted between two polarizing films which were perpendicular and laminated by an adhesive to form a film structure having light yellow color. The structure was exposed to a UV laser as shown in FIG. 2 and heated at 100° C. The conditions of the images are shown in FIG. 6.

Example 4

A uniaxially oriented film having following chemical structure was inserted between two polarizing films which were perpendicular and laminated by an adhesive to form a film structure having light yellow color.

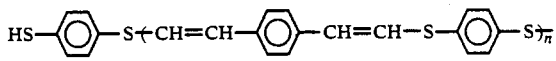

[wherein n=11 to 13.]

The structure was exposed to a light having 527 nm and then exposed to a light having 546 nm. The conditions of the images are shown in FIG. 6.

Example 5

A uniaxially oriented polyvinyl alcohol film was inserted between two polarizing films which were parallel and laminated by an adhesive to form a film structure having green color. The structure was exposed to a semiconductor laser as shown in FIG. 2, but an exposing time was reduced to about ¼ of Example 1. Then another portion of the structure was exposed to the laser, but an exposing time was reduced to about ½ of Example 1. The conditions of the images are shown in FIG. 6.

Example 6

A biaxially oriented polyethylene film was adhered on a biaxially oriented polypropylene film and then inserted between two polarizing films which were perpendicular. The three films were laminated by an adhesive to form a film structure having red color. The structure was exposed to a semiconductor laser as shown in FIG. 2, but an exposing time was changed to two times and three times of Example 1. The conditions of the images are shown in FIG. 6.

What is claimed is:

1. A process for recording an image comprising
   (i) inserting an anisotropic molecular oriented film between two polarizing film of which polarization directions are parallel or perpendicular to each other, so that the anisotropy of said anisotropic molecular oriented film forms an angle of 45° to the polarization directions of said polarizing film, and
   (ii) completely or incompletely degrading the anisotropy of an image portion in said anisotropic molecular oriented film.

2. The process according to claim 1 wherein one of said polarizing films is changed to a reflective film.

3. A film structure for recording an image comprising two polarizing films of which polarization directions are parallel or perpendicular to each other and an anisotropic molecular oriented film sandwiched between said two polarizing films, wherein said anisotropic molecular oriented film has an anisotropy of molecular orientation of about 45° at an angle to the polarization directions of said polarizing films and has an image portion of which the anisotropy of the molecular orientation is degraded completely or incompletely by heat or light.

4. The laminated film structure according to claim 3 wherein one of said polarizing films is changed to a reflective film.

5. A printing apparatus in which a negative or positive type photosensitive printing plate is exposed to a light source through a negative or positive film, wherein said negative or positive film comprises two polarizing films of which polarization directions are parallel or perpendicular to each other and an anisotropic molecular oriented film sandwiched between said two polarizing films, and said anisotropic molecular oriented film has an anisotropy of molecular orientation which forms an angle of about 45° to the polarization directions of said polarizing films and has an image portion of which the anisotropy of the molecular orientation is degraded completely or incompletely by heat or light.

* * * * *